(12) United States Patent
Wong et al.

(10) Patent No.: US 8,877,617 B2
(45) Date of Patent: Nov. 4, 2014

(54) METHODS AND STRUCTURES FOR FORMING AND PROTECTING THIN FILMS ON SUBSTRATES

(71) Applicant: SunPower Corporation, San Jose, CA (US)

(72) Inventors: Jia Yi Wong, Melaka (MY); Thomas Qiu, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 59 days.

(21) Appl. No.: 13/628,671

(22) Filed: Sep. 27, 2012

(65) Prior Publication Data

US 2014/0087496 A1    Mar. 27, 2014

(51) Int. Cl.
*H01L 21/00*    (2006.01)
*H01L 33/52*    (2010.01)
*H01L 31/18*    (2006.01)

(52) U.S. Cl.
CPC .............. *H01L 31/18* (2013.01); *H01L 33/52* (2013.01)
USPC ........................................................ 438/482

(58) Field of Classification Search
CPC .................... H01L 21/0237; C23C 16/4404
See application file for complete search history.

(56) References Cited

U.S. PATENT DOCUMENTS

| | | | |
|---|---|---|---|
| 6,472,336 B1 | 10/2002 | Pangrle et al. | |
| 6,875,674 B2* | 4/2005 | Asami et al. | 438/482 |
| 2003/0143410 A1* | 7/2003 | Won et al. | 428/448 |
| 2005/0221002 A1 | 10/2005 | Nakamura et al. | |
| 2008/0178807 A1* | 7/2008 | Wang et al. | 118/723 R |
| 2009/0029530 A1 | 1/2009 | Kunii | |
| 2011/0183458 A1 | 7/2011 | Weidman et al. | |

OTHER PUBLICATIONS

Kamilla Iskenderova, et al. "Cleaning Process in High Density Plasma Chemical Vapor Deposition Reactor", Oct. 2003, 118 sheets, A Thesis submitted to the Faculty of Drexel University.
International Search Report and Written Opinion of the International Searching Authority for Application No. PCT/US2013/062162, mailed Aug. 20, 2014, 7 sheets.

* cited by examiner

*Primary Examiner* — Calvin Choi
*Assistant Examiner* — Andre' C Stevenson
(74) *Attorney, Agent, or Firm* — Okamoto & Benedicto LLP (57) ABSTRACT

A method for forming of a thin film on a substrate is disclosed. The method includes cleaning a process chamber by flowing a first gas having fluorine. The method also includes coating the process chamber with a first encapsulating layer including amorphous silicon (A-Si) by flowing a second gas for a first duration, where the first encapsulating layer protects against fluorine contamination. The method further includes loading a substrate into the process chamber, depositing a thin film on the substrate by flowing a third gas into the process chamber and unloading the substrate from the process chamber. The thin film can include silicon nitride (SiN), the first gas can include nitrogen triflouride ($NF_3$) gas and second gas can include silane ($SiH_4$) gas. The thin film can be formed using plasma-enhanced chemical vapor deposition. The substrate can be a solar cell or a liquid crystal display (LCD).

20 Claims, 11 Drawing Sheets

Results of SIMS Analysis

| Sample | F(atomic %) | F | Cr | Mg | Fe | Ni |
|---|---|---|---|---|---|---|
| Center | 0.3 | 2.6e20 | 6.4e15 | 5.2e15 | ≤2e16 | ≤3e16 |
| Edge | 1.2 | 1.2e21 | 6.5e15 | 1.5e16 | ≤2e16 | ≤3e16 |

Table 1. Clean Process

| Step | Description | Chemical Reaction |
|---|---|---|
| 1 | Nitrogen triflouride (NF$_3$) gas is released into the process chamber where it ionizes into its component parts: nitrogen (N$_2$) and fluorine (F). | 2NF$_3$ → N$_2$ + 6F |
| 2 | The fluorine (F) reacts with silicon nitride (Si$_3$N$_4$) to form silicon tetrafluoride (SiF$_4$) gas and nitrogen (N$_2$) gas. Both gases are flowed out of the process chamber through the vacuum channel. | 12F + Si$_3$N$_4$ → 3SiF$_4$ + 2N$_2$ |
| 3 | Excess fluorine (F) residue is left around the process chamber and chamber walls | F |

FIG. 10

Table 2. Fluorine Removal

| Step | Description | Chemical Reaction |
|---|---|---|
| 1 | Silane ($SiH_4$) gas is released into the process chamber where it ionizes into its component parts: silicon (Si) and hydrogen (H) | $SiH_4 \rightarrow Si + 4H$ |
| 2 | Hydrogen (H) reacts with the residual fluorine (F) to form gaseous hydrofluoric acid (HF) | $2H + F_2 \rightarrow 2HF$ |
| 3 | Left over gaseous hydrofluoric acid (HF) only reacts with oxides and does not target the silicon substrate. Gaseous hydrofluoric acid (HF) is also flowed out of the process chamber through the vacuum channel | HF |

FIG. 11

Table 3. Additional Moisture Removal

| Step | Description | Chemical Reaction |
|---|---|---|
| 1 | Silane ($SiH_4$) gas is released into the process chamber where it ionizes into its component parts: silicon (Si) and hydrogen (H) | $SiH_4 \rightarrow Si + 4H$ |
| 2 | The excess hydrogen (H) forms hydrogen gas ($H_2$) which can be flowed out of the process chamber through the vacuum channel. | $2H \rightarrow H_2$ |
| 3 | The moisture ($H_2O$) is removed during processing where the amorphous silicon surface converts the moisture ($H_2O$) into silicon dioxide ($SiO_2$) and hydrogen gas ($H_2$) | $Si + 2H_2O \rightarrow SiO_2 + 2H_2$ |
| 4 | The excess hydrogen gas (H ) can be flowed out of the process chamber through the vacuum channel | $H_2$ |

FIG. 12

| Clean + Seasoning | | | | | | |
|---|---|---|---|---|---|---|
| Step Name | Ar | Clean | Clean | Stab | SiH4 | N2 Purge |
| | 1 | 2 | 3 | 4 | 5 | 6 |
| NF3 Flow (slm) | 0 | 0-50 | 0-50 | 0 | 0 | 0 |
| SiH4 Flow (slm) | 0 | 0 | 0 | 0-10 | 0-10 | 0 |
| Ar Flow (slm) | 0-10 | 0 | 0 | 0 | 0 | 0 |
| N2 Flow (slm) | 0 | 0 | 0 | 0 | 0 | 0-50 |
| Pressure (mTorr) | 0-10 | 0-10 | 0-10 | 0-10 | 0-10 | 0-10 |
| RF Power (kW) | 0-10 | 0-10 | 0-10 | 0 | 0-10 | 0 |
| Remote plasma | on | on | on | off | off | off |
| Time (s) | 1-30 | 1-30 | 1-1500 | 1-30 | 1-500 | 1-500 |

METHODS AND STRUCTURES FOR FORMING AND PROTECTING THIN FILMS ON SUBSTRATES

TECHNICAL FIELD

Embodiments of the subject matter described herein relate generally to chemical vapor deposition (CVD) techniques for forming thin films on substrates More particularly, embodiments of the subject matter relate to plasma-enhanced chemical vapor deposition (PECVD) for forming an anti-reflective coating (ARC) including silicon nitride on a solar cell and related solar cell fabrication processes.

BACKGROUND

Chemical vapor deposition (CVD) techniques are well known processes for forming thin films on substrates. Such chemical vapor deposition (CVD) techniques include atmospheric pressure chemical vapor deposition (APCVD), low-pressure chemical vapor deposition (LPCVD) and plasma-enhanced chemical vapor deposition (PECVD). These techniques can form thin films including silicon dioxide ($SiO_2$), polysilicon (Si) and silicon nitride (SiN) on substrates. Such substrates used in chemical vapor deposition (CVD) techniques include integrated circuits, liquid crystal displays (LCD) and solar cells.

Techniques for improving the formation of a thin film on a substrate during manufacturing are very beneficial as these are an intrinsic part of the standard device fabrication process. Such techniques may improve overall output yield, decreasing overall manufacturing time and increasing the available product yield. In the case of a solar cell, these techniques can include improving the formation of anti-reflective coatings (ARC) including silicon nitride film on silicon substrates. They can also significantly improve the total solar cell efficiency.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description. Additionally, numerous specific details are set forth, such as specific process flow operations, in order to provide a thorough understanding of embodiments of the present invention. It will be apparent to one skilled in the art that embodiments of the present invention may be practiced without these specific details. In other instances, well-known fabrication techniques, such as lithographic, etch techniques and standard thin film deposition, are not described in detail in order to not unnecessarily obscure embodiments of the present invention. Furthermore, it is to be understood that the various embodiments shown in the figures are illustrative representations and are not necessarily drawn to scale.

A method for forming a thin film on a substrate is disclosed. The method includes flowing a first gas including fluorine to clean a process chamber, flowing a second gas over a first duration to coat the process chamber with a first encapsulating layer made up of amorphous silicon and where the first encapsulating layer protects against fluorine contamination. The method also includes loading a substrate into the process chamber, depositing a thin film on the substrate by flowing a third gas into the process chamber and unloading the substrate from the process chamber. In one embodiment, the method includes a solar cell substrate. In another embodiment, the method includes forming an anti-reflective coating (ARC) including silicon nitride film on the solar cell. In yet another embodiment, the substrate can be a liquid crystal display (LCD). In this embodiment, forming a thin film on a liquid crystal display (LCD) includes forming an insulating layer on a LCD. In still another embodiment, the first duration can be in the range of 0.5-5 minutes.

A method for forming a silicon nitride film on a solar cell is disclosed. The method includes flowing a first gas having fluorine to clean a process chamber from excess silicon nitride (SiN), flowing a second gas for a first duration to coat the process chamber with amorphous silicon and where the amorphous silicon forms a first encapsulating layer to protect against fluorine contamination. The method also includes loading a solar cell in the process chamber, depositing a silicon nitride film on the solar cell by plasma-enhanced chemical vapor deposition (PECVD) and unloading the solar cell from the process chamber. In an embodiment, the first duration can be in the range of 0.5-5 minutes. In another embodiment, the amorphous silicon forms a first encapsulating layer with a thickness in the range of 0.05-0.5 microns.

A method for forming a silicon nitride film on a solar cell is disclosed. The method includes providing a solar cell having a front side configured to face the sun during normal operation and a back side opposite the front side. The method also includes flowing nitrogen triflouride ($NF_3$) gas to clean a process chamber from excess silicon nitride (SiN); flowing silane ($SiH_4$) gas for at most 5 minutes to coat the process chamber with amorphous silicon and where the amorphous silicon forms a first encapsulating layer to protect against fluorine contamination. The method further includes loading the solar cell in the process chamber, depositing an anti-reflective coating (ARC) comprising a silicon nitride (SiN) film on the front side of the solar cell by plasma-enhanced chemical vapor deposition (PECVD) of silane ($SiH_4$), ammonia ($NH_3$) and nitrogen ($N_2$) gas and unloading the solar cell from the process chamber. In an embodiment, the method includes forming an anti-reflective coating on a back side (BARC) of a solar cell. In another embodiment, the method includes providing a solar cell selected from the group containing a back-contact solar cell, front-contact solar, monocrystalline silicon solar cells, polycrystalline silicon solar cells, amorphous silicon solar cells, thin film silicon solar cells, copper indium gallium selenide (CIGS) solar cells, and cadmium telluride solar cells. In still another embodiment, the amorphous silicon forms a first encapsulating layer with a thickness in the range of 0.05-0.5 microns.

Figure 1:
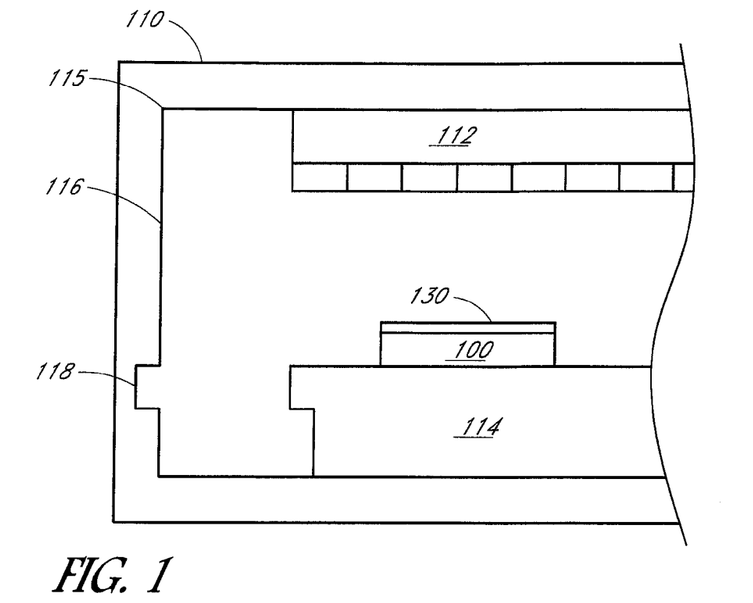
FIG. 1 is a cross-sectional representation of a process chamber in accordance with a standard process for forming a thin film on a substrate.

FIG. 1 illustrates a standard process chamber 110 used in forming a thin film 130 on a substrate 100. The process chamber 110 can have a showerhead 112, a chamber corner 115, a chamber wall 116, a vacuum channel 118 and a process tray 114. The process chamber can be any chamber used in standard chemical vapor deposition (CVD) processes, including plasma-enhanced chemical vapor deposition (PECVD) chamber. The gas inlet or showerhead 112 functions to flow gas into the process chamber 110. The vacuum channel 118 serves as an outlet for gas to be pumped out of the process chamber 110. The process tray 114 is used to hold substrates 100.

Figure 2:
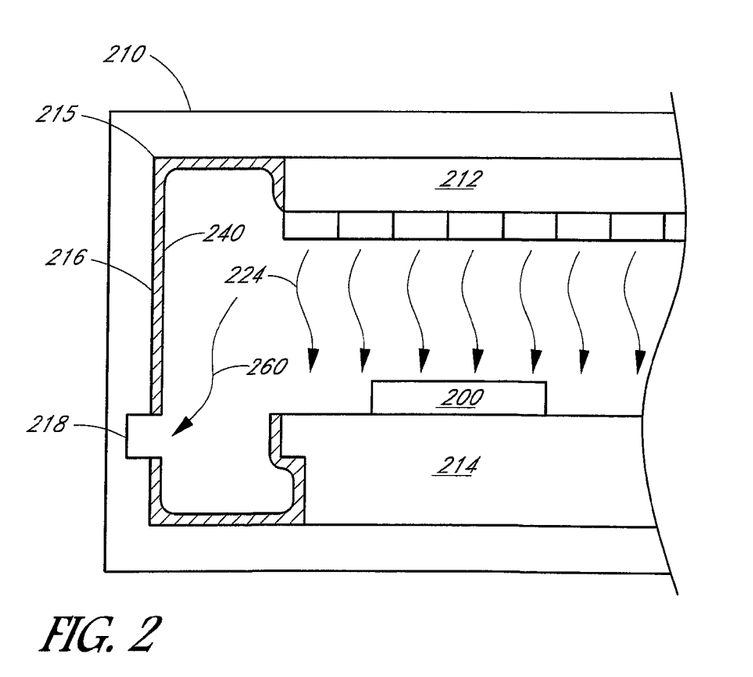
FIGS. 2 and 3 are cross-sectional representations of a process chamber in accordance with a standard process for forming a thin film on a substrate.
Figure 3:
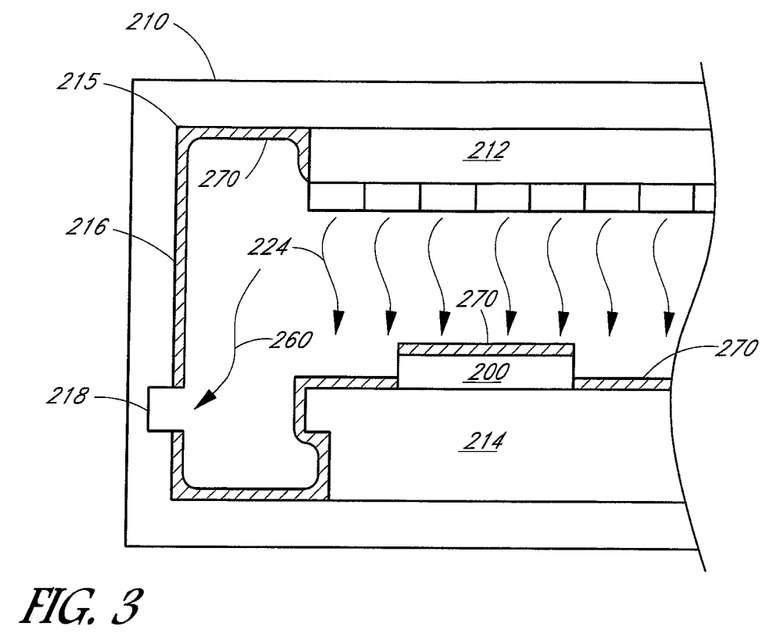

FIGS. 2 and 3 illustrate operations in a standard process for forming a thin film on a substrate. The operation includes providing a process chamber 210 having a showerhead 212, a chamber corner 215, a chamber wall 216, a vacuum channel 218 and a process tray 214. The components of the process chamber 210 having a similar function as the process chamber 110 described in FIG. 1. The operation also includes a cleaning step and a thin film deposition step. The cleaning step can include flowing a gas having fluorine into the process chamber 210. The gas having fluorine functions to react with any remaining substances within the process chamber 210. Such remaining substances can include thin films, such as silicon nitride (SiN), which may have come from a previous deposition or cleaning processes. A by-product of flowing the gas comprising fluorine into the process chamber 210 is a thin layer of fluorine residue 240. The fluorine residue 240 can accumulate around the process chamber 210 as seen in FIG. 2. A layer of silicon nitride (SiN) may be deposited within the process chamber 210 to encapsulate and remove fluorine residue 240. Subsequent to the cleaning step, the deposition step can include loading a substrate 200 into the process chamber 210 on the process tray 214. A source gas 224 is flowed into the process chamber 210 to form a thin film 270 on the substrate 200 as shown in FIG. 3. In an embodiment to the standard process, the substrate 200 can be a solar cell. In another embodiment, plasma-enhanced chemical vapor deposition (PECVD) can be used to form the thin film on the solar cell. In still another embodiment, the thin film may include silicon nitride (SiN). In yet another embodiment, forming a thin film 270 can include forming an anti-reflective coating (ARC) on a solar cell using plasma-enhanced chemical vapor deposition (PECVD).

Figure 4:
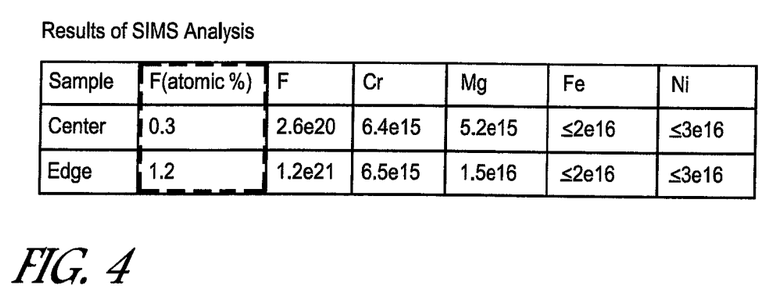
FIG. 4 is a table including the secondary ion mass spectrometry (SIMS) test results used in accordance with an embodiment of the present invention.

With reference to FIG. 4, there are shown secondary ion mass spectrometry (SIMS) test results of several solar cells subsequent to plasma-enhanced chemical vapor deposition (PECVD) of silicon nitride for forming an anti-reflective coating (ARC). The results show different elemental contamination levels at the center and along the edges of the solar cell. The elements sampled include fluorine (F), chromium (Cr), magnesium (Mg), iron (Fe) and nickel (Ni). The results clearly show that there is 4 times more fluorine contamination (1.2) along the edges of the silicon substrate then on the center (0.3). It is known that residual fluorine incorporated inside plasma-enhanced chemical vapor deposition (PECVD) silicon nitride films may block diffusion of hydrogen to the silicon surface. Hydrogen diffusion to the silicon surface is also known to passivate dangling bonds of silicon on surfaces, which in turn reduces the number density of electronic defects on silicon surfaces and reduces surface recombination. By blocking hydrogen diffusion to the silicon surfaces, fluorine reduces the positive hydrogen passivation effect or surface passivation of a solar cell device. Residual fluorine contamination in the silicon nitride (SiN) film may also lower the dielectric 185 constant of the silicon nitride (SiN) film lowering the overall solar cell refractive index (RI). Since fluorine is the most electron negative element, residual fluorine contamination in the silicon nitride (SiN) film could build up negative charges, attracting minority carriers to the surface and increasing surface recombination losses. Thus, losses due to low surface passivation, lower refractive index (RI) and increased recombination can decrease the overall solar cell efficiency.

The inventors hypothesized that the edges of the solar cells from the test above were closest to regions of fluorine residue accumulation within the process chamber. These regions include the chamber walls, chamber corners and the tray corners. As mentioned above, a solution to remove the fluorine residue is to deposit silicon nitride (SiN) within the process chamber during the cleaning step. A drawback to this process is that a thick layer of silicon nitride (SiN) would be needed to achieve acceptable fluorine residue encapsulation and prevent contamination. Performing such a process would be costly and take too much processing time. Also, the silicon nitride (SiN) deposition alone may not be enough to fully encapsulate the fluorine residue around the chamber corners and the tray corners, as observed in the test results described above. Thus, the inventors propose a method for forming a thin film on a substrate which provides additional protection against fluorine contamination. The methodology to the proposed solution is described below, including test results showing improved refractive index (RI) and solar cell efficiency performance.

Figure 5:
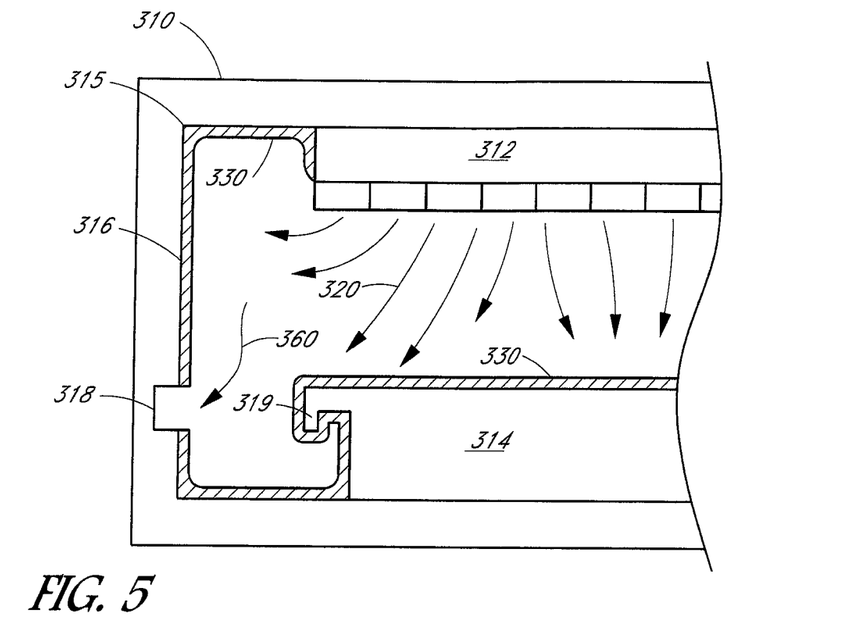
FIGS. 5-9 are cross-sectional representations of a process chamber in accordance with an embodiment of the present invention.
Figure 6:
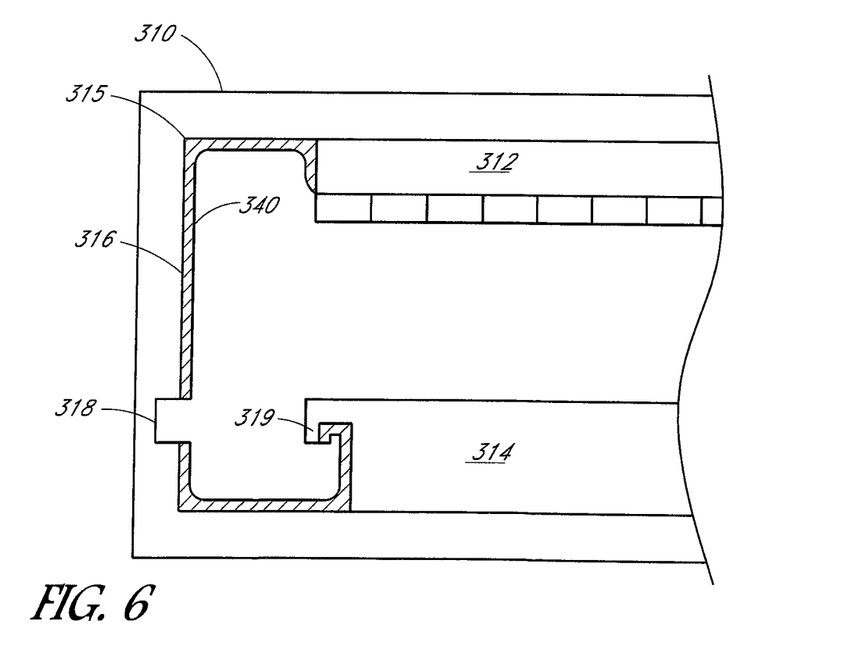

With reference to FIGS. 5 and 6, there are shown a method of forming of a thin film on a substrate. The method includes providing a process chamber 310 having a showerhead 312, a chamber wall 316, a vacuum channel 318 and a process tray 314 with a tray corner 319. The components of the process chamber 310 having a similar function as the process chamber 110 described in FIG. 1. The method also includes cleaning the process chamber 310 by flowing a first gas having fluorine 320 as seen in FIG. 5. The first gas 320 functions to react with any remaining thin film 330 within the process chamber 310. The remaining thin film 330 originating from previous deposition or cleaning processes. In an embodiment, the first gas can include nitrogen triflouride ($NF_3$) and the thin film can be silicon nitride (SiN). The reaction between the first gas having fluorine 320 and remaining thin film 330 produces a first product gas 360. The first product gas 360 is removed from the process chamber 310 by flowing it out through the vacuum channel 318. In an embodiment, the first product gas 360 can include silicon tetrafluoride ($SiF_4$) gas and nitrogen ($N_2$) gas. A by-product of flowing the first gas having fluorine 320 into the process chamber 310 is a thin layer of fluorine residue 340. The fluorine residue 340 can accumulate around the process chamber 310, specifically along the process chamber walls 316, chamber corners 315 and tray corners 319 as seen in FIG. 6.

Figure 7:
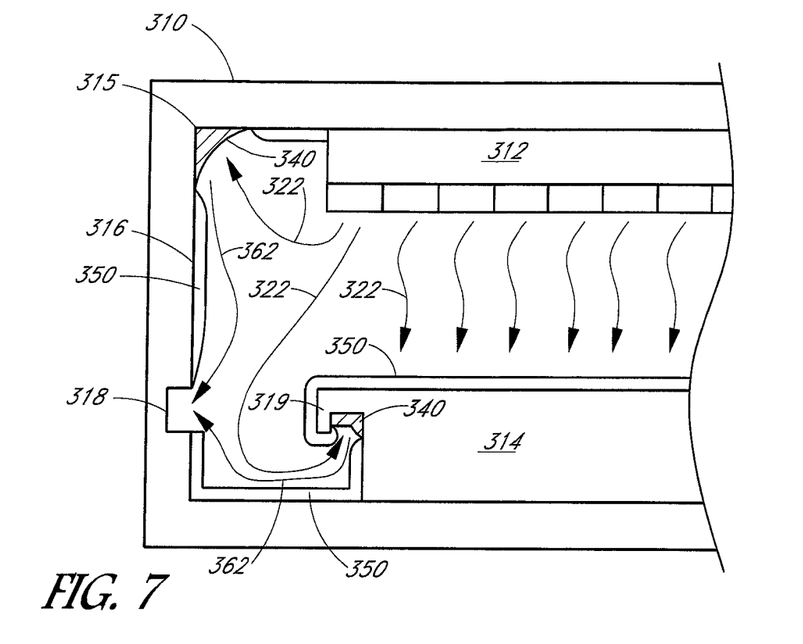

FIG. 7 illustrates a continuation of the method of forming of a thin film on a substrate 300. The method further includes flowing a second gas 322 into the process chamber 310 to remove fluorine reside 340. The second gas 322 reacts with the fluorine residue 340, including fluorine residue 340 along the chamber corners 315 and tray corners 319, to produce a second product gas 362, where the second product gas 362 is flowed out of the process chamber 310 through the vacuum channel 318 as seen in FIG. 7. Continuing to flow the second gas 322 completely coats the process chamber with a first encapsulating layer 350 which protects against fluorine contamination. In an embodiment, the second gas 322 is silane ($SiH_4$) and the first encapsulating layer 350 includes amorphous silicon (A-Si). In another embodiment, the second product gas 362 is gaseous hydrofluoric acid (HF). In yet another embodiment, the first encapsulating layer 350 may have a thickness in the range of 0.05-0.5 microns. In another embodiment, the first encapsulating layer 350 can include amorphous silicon (A-Si) and may have a thickness in the range of 0.05-0.5 microns. In still another embodiment, the moisture ($H_2O$) within the process chamber 310 is removed during the formation of a first encapsulating layer 350. In yet another embodiment, the moisture ($H_2O$) within the process chamber 310 is removed during the formation of an amorphous silicon encapsulating layer 350 (A-Si), where the amorphous silicon (A-Si) converts the moisture ($H_2O$) into silicon dioxide ($SiO_2$) and hydrogen gas ($H_2$). The hydrogen gas ($H_2$) can be removed from the process chamber 310 through the vacuum channel 318. In yet another embodiment, providing a first encapsulating layer 350 including amorphous silicon (A-Si) protects against residual dopant contamination. In the same embodiment where the first encapsulating layer 350 protects against residual dopant contamination, the residual dopants may include Phosphine ($PH_3$) and Diborane ($B_2H_6$). In another embodiment, a second encapsulating layer may be subsequently deposited over the first encapsulating layer 350. In the same embodiment where a second encapsulating layer may be deposited, the second encapsulating layer can include silicon nitride (SiN) and the first encapsulating layer can include amorphous silicon (A-Si). In still another embodiment, the two-layer amorphous silicon (A-Si) and silicon nitride (SiN) encapsulating layers form a barrier film which protects against metal contamination.

Figure 8:
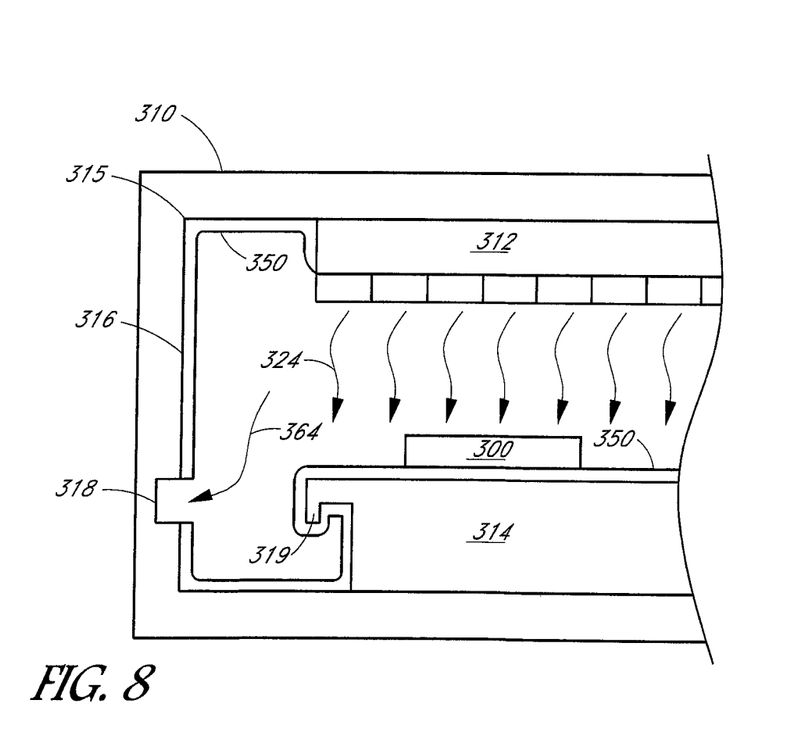
Figure 9:
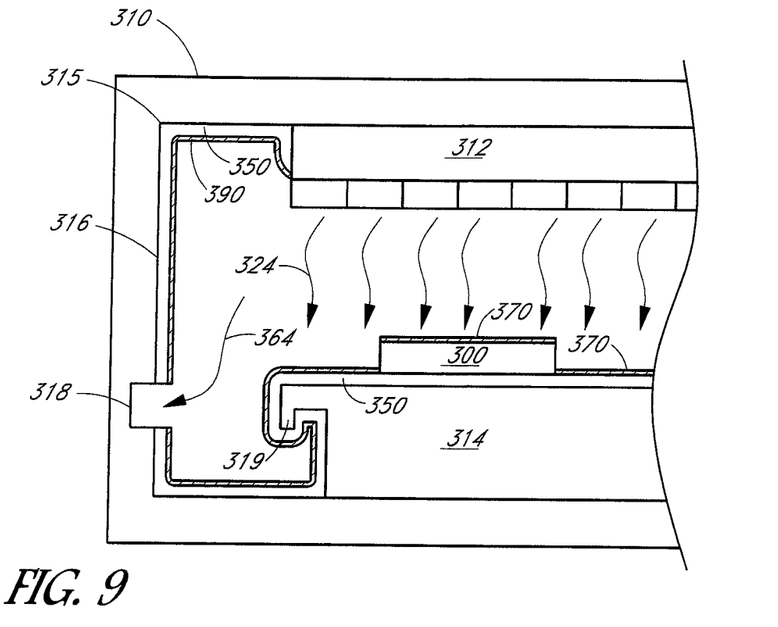

With reference to FIGS. 8 and 9, there are shown a continuation of the method of forming of a thin film on a substrate 300. The method further includes providing a substrate 300 loaded into the process chamber 310 on the process tray 314. A third gas 324 is flowed into the process chamber 310 to form a thin film 370 on the substrate 300. In an embodiment, a thin film 370 can be deposited around the process chamber 310 including on the chamber wall 316, chamber corners 315, process tray 314 and process tray corners 319 as shown in FIGS. 8 and 9. In another embodiment, the third gas can include a gas selected from the group containing silane ($SiH_4$), ammonia ($NH_3$) and nitrogen ($N_2$). In still another embodiment, the thin film 370 can include silicon nitride (SiN). In yet another embodiment, the substrate 300 can be a solar cell from SunPower Corporation. In an embodiment, the first duration can be in the range of 0.5-5 minutes. In an embodiment, forming a thin film 370 on a substrate 300 can include forming an anti-reflective coating (ARC) on a solar cell. In another embodiment, forming a thin film 370 on a substrate 300 can include forming an anti-reflective coating on the back side (BARC) of a solar cell. In yet another embodiment, the substrate may come from a solar cell selected from the group containing front-contact solar cells, back-contact solar cells, monocrystalline silicon solar cells, polycrystalline silicon solar cells, amorphous silicon solar cells, thin film silicon solar cells, copper indium gallium selenide (CIGS) solar cells, and cadmium telluride solar cells.

Figure 10:
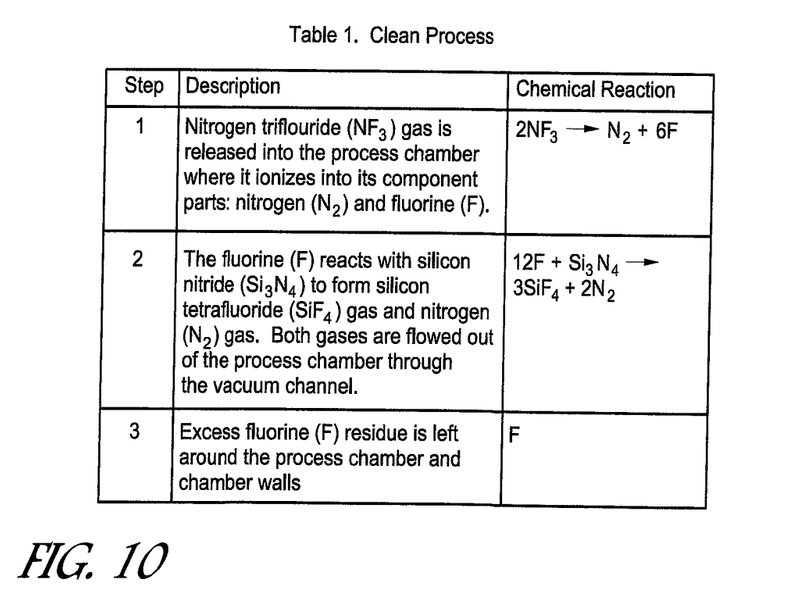
FIGS. 10-12 are tables including the chemical equations used in accordance with an embodiment of the present invention.
Figure 11:
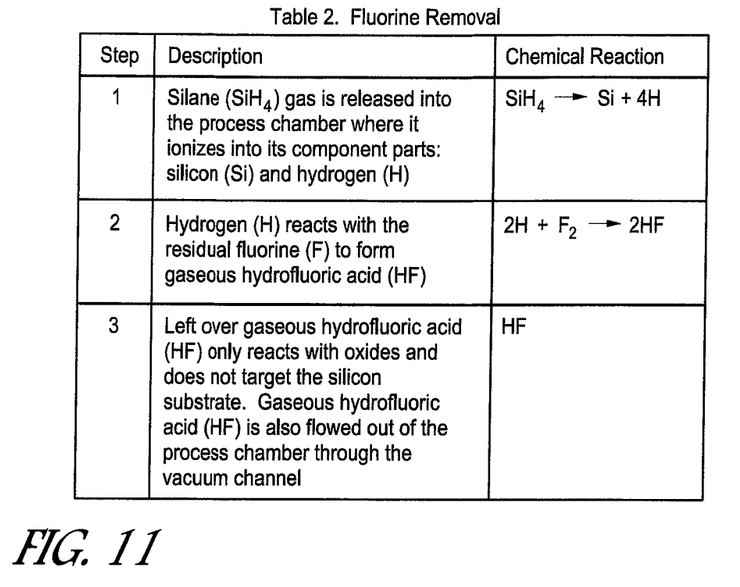
Figure 12:
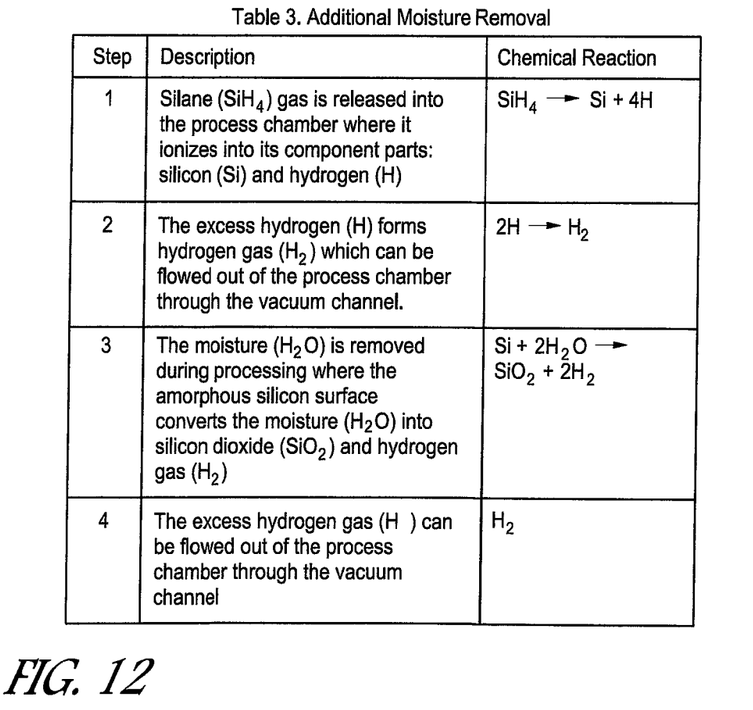

FIGS. 10-12 illustrate tables that describe the chemical reactions covered in an embodiment for forming a thin film on a substrate. FIG. 10 discloses the chemical reactions included for the nitrogen triflouride ($NF_3$) clean, FIG. 11 discloses the chemical reactions included for fluorine removal and FIG. 12 discloses the chemical reactions included for additional moisture removal.

Figure 13:
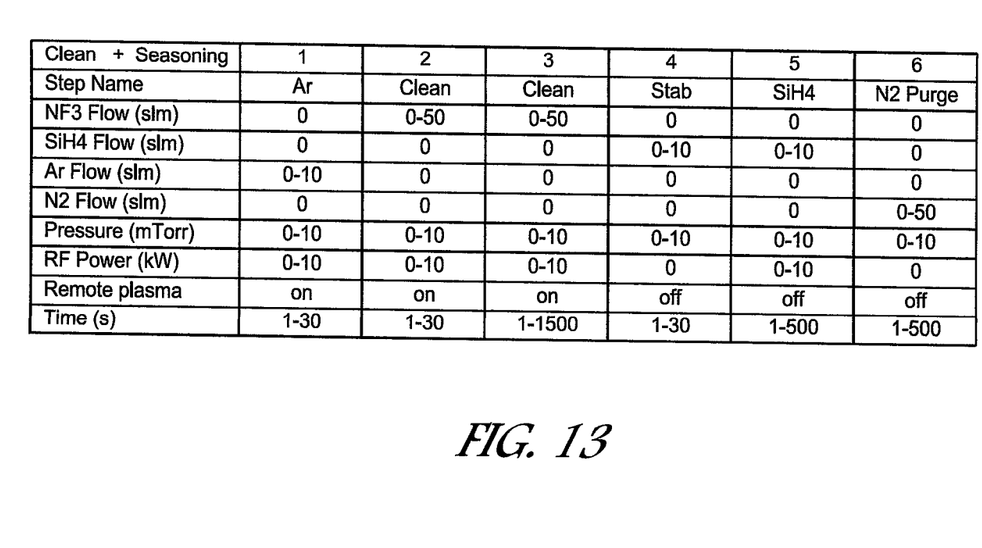
FIG. 13 is a sample process recipe used for cleaning a process chamber in accordance with an embodiment of the present invention.

FIG. 13 shows typical process conditions for clean and seasoning operations, including a step name, flow rates, chamber pressure, RF (Radio-Frequency) power, and processing time. In a first example, the nitrogen triflouride ($NF_3$) gas flow can vary between 5-20 standard liters per minute (slm), although larger range can be used. In second example, the silane ($SiH_4$) gas flow can vary between 1-5 standard liters per minute (slm), where a larger range can also be used. In a third example, an Argon (Ar) gas flow can vary between 1-6 standard liters per minute (slm), although larger ranges can also be used. In a fourth example, the nitrogen ($N_2$) gas flow can vary between 10-30 standard liters per minute (slm), where a larger range can be used. In a fifth example, the chamber pressure can vary between 0.4-6 millitorr (mTorr). In a sixth example, the chamber pressure can vary between 0.1-6 millitorr (mTorr), although larger range can also be used. In a seventh example, RF power can vary between 0.1-4 kilowatts (kW). In an eighth example, RF power can vary between 0-6 kilowatts (kW), where a larger range can also be used. In a ninth example, the duration for a typical operation can vary between a duration selected from the group containing 2-20 seconds, 5-20 seconds, 5-200 seconds and 20-1200 seconds. FIG. 13 displays exemplary ranges that can be alternatively implemented for the various flow rates, chamber pressure, RF power and durations listed above.

Figure 14:
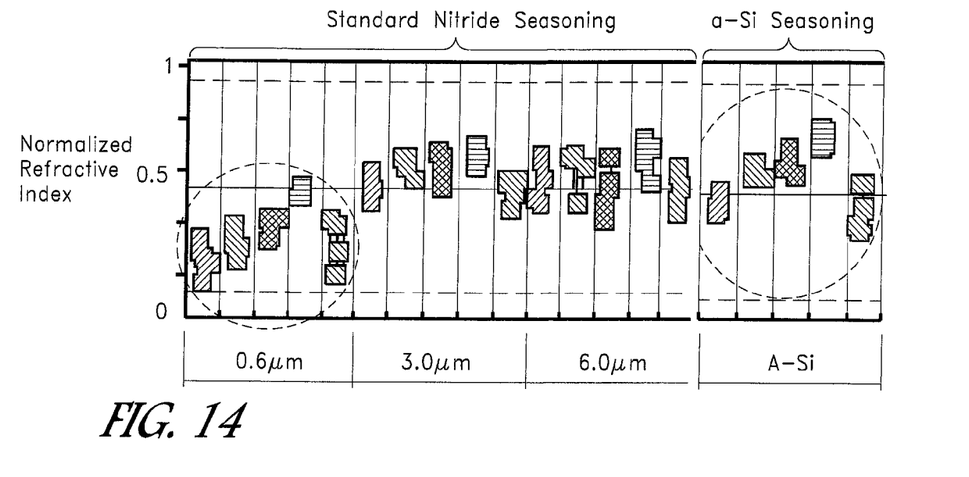
FIG. 14 is a graphical representation of test results for refractive index comparison between process recipes used in accordance with an embodiment of the present invention.

FIG. 14 shows the effect of chamber seasoning on refractive index (RI) of anti-reflective coating (ARC) nitrides. Using standard silicon nitride (SiN) seasoning of 0.6 μm thickness, the refractive index (RI) of anti-reflective coating (ARC) nitrides is low subsequent to chamber clean and seasoning. As anti-reflective coating (ARC) nitride films accumulate along the chamber walls and the showerhead, the refractive index (RI) of the anti-reflective coating (ARC) nitride film increases. After accumulation of 3.0 μm anti-reflective coating (ARC) nitride films in the chamber, the nitride refractive index (RI) becomes stable. Using amorphous silicon (A-Si) seasoning, the low refractive index (RI) issue after chamber clean is eliminated. Thus the amorphous silicon (A-Si) seasoning is preferred due to the improvement in the refractive index (RI) performance.

Figure 15:
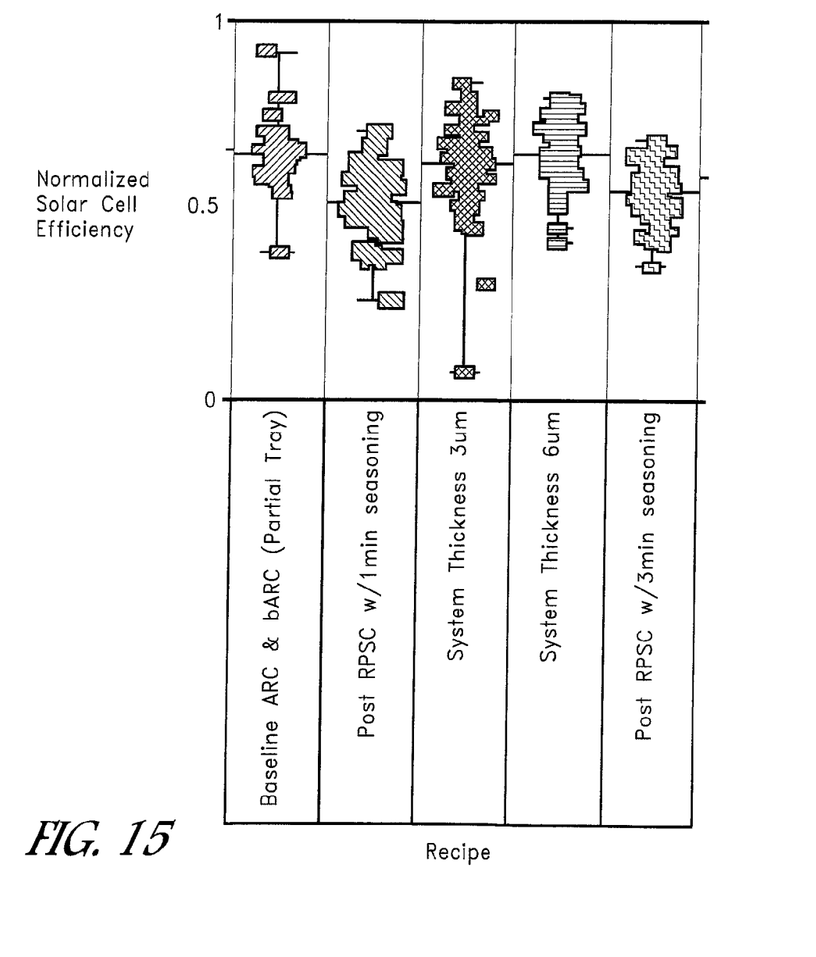
FIG. 15 is a graphical representation of test results for solar cell efficiency comparison between process recipes used in accordance with an embodiment of the present invention.

FIG. 15 compares solar cell efficiencies for various seasoning recipes. Solar cells fabricated subsequent to 1 minute silicon nitride (SiN) seasoning have the lowest solar cell efficiency. Increasing silicon nitride (SiN) seasoning to 3 minutes slightly improves the solar cell efficiency. When the chamber is coated by thick silicon nitride (SiN) films, e.g., 3 μm-6 μm, solar cell efficiencies increase significantly. As seen in FIG. 15, the results for the baseline recipe including the amorphous silicon (A-Si) seasoning technique discussed above is comparable to the results from the thick silicon nitride (SiN) films. Depositing such a thick layer of silicon nitride (SiN) films is very costly and takes much longer to process then forming an amorphous silicon (A-Si) film. Thus, the amorphous silicon (A-Si) seasoning recipe is preferred due to the improvement in the overall solar cell efficiency performance at a reduced processing time.

Although the above results are presented focusing on solar cell substrates, the method described above can be used with any variety of substrates for the formation of thin films. In an embodiment, the substrate can include a liquid crystal display (LCD). In the same embodiment were the substrate is a liquid crystal display (LCD), forming a thin film on the substrate can include forming an insulating layer on the liquid crystal display (LCD). In still another embodiment, plasma-enhanced chemical vapor deposition (PECVD) can be used to form an insulating layer on the liquid crystal display (LCD).

Figure 16:
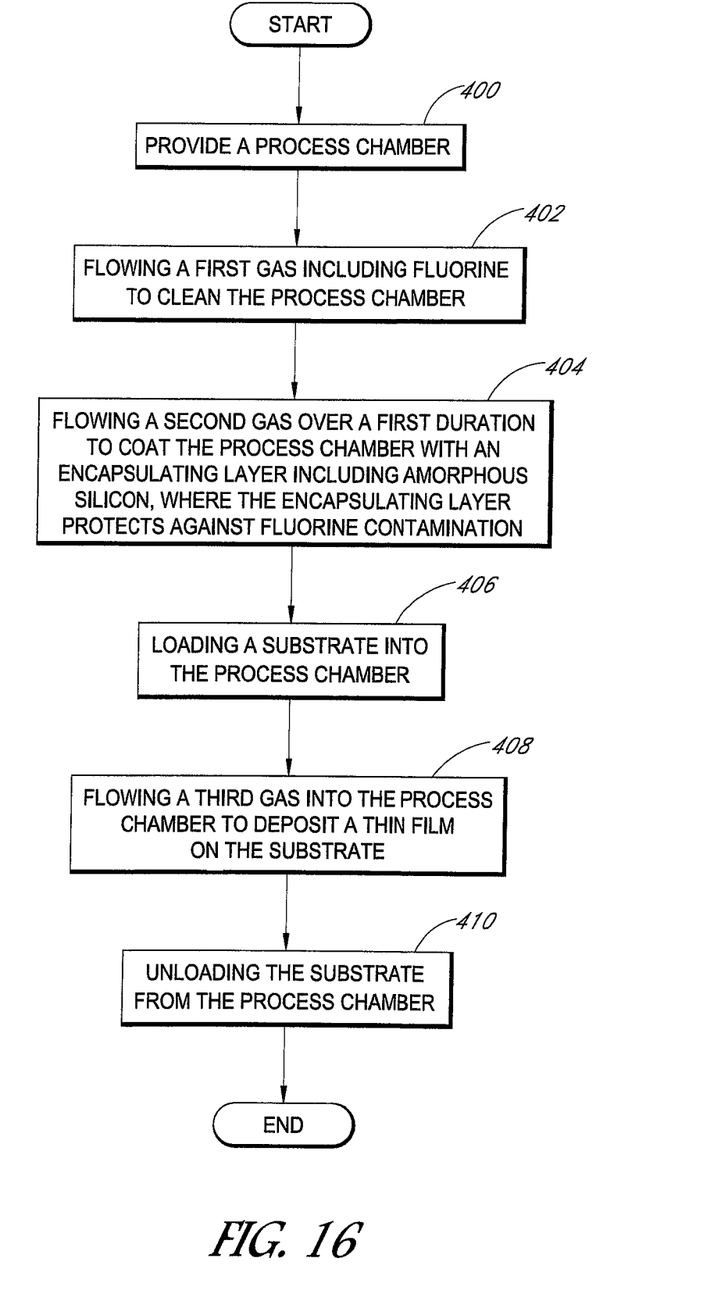
FIG. 16 is flowchart representation of forming a thin film on a substrate in accordance with an embodiment of the present invention.

With reference to FIG. 16, a flow chart of an embodiment for forming a thin film on a substrate is shown. As described above, the first operation 400 can include providing a process chamber 310. The second operation 402 can include flowing a first gas including fluorine 320 to clean the process chamber 310. The third operation 404 can include flowing a second gas 322 over a first duration to coat the process chamber 310 with a first encapsulating layer 350 having amorphous silicon and where the first encapsulating layer protects against fluorine contamination. The fourth 406 operation can include loading a substrate 300 into the process chamber 310. The fifth operation 408 can include flowing a third gas 324 into the process chamber 310 to deposit a thin film 370 on the substrate 300. The last operation 410 can include unloading the substrate 300 from the process chamber 310.

Figure 17:
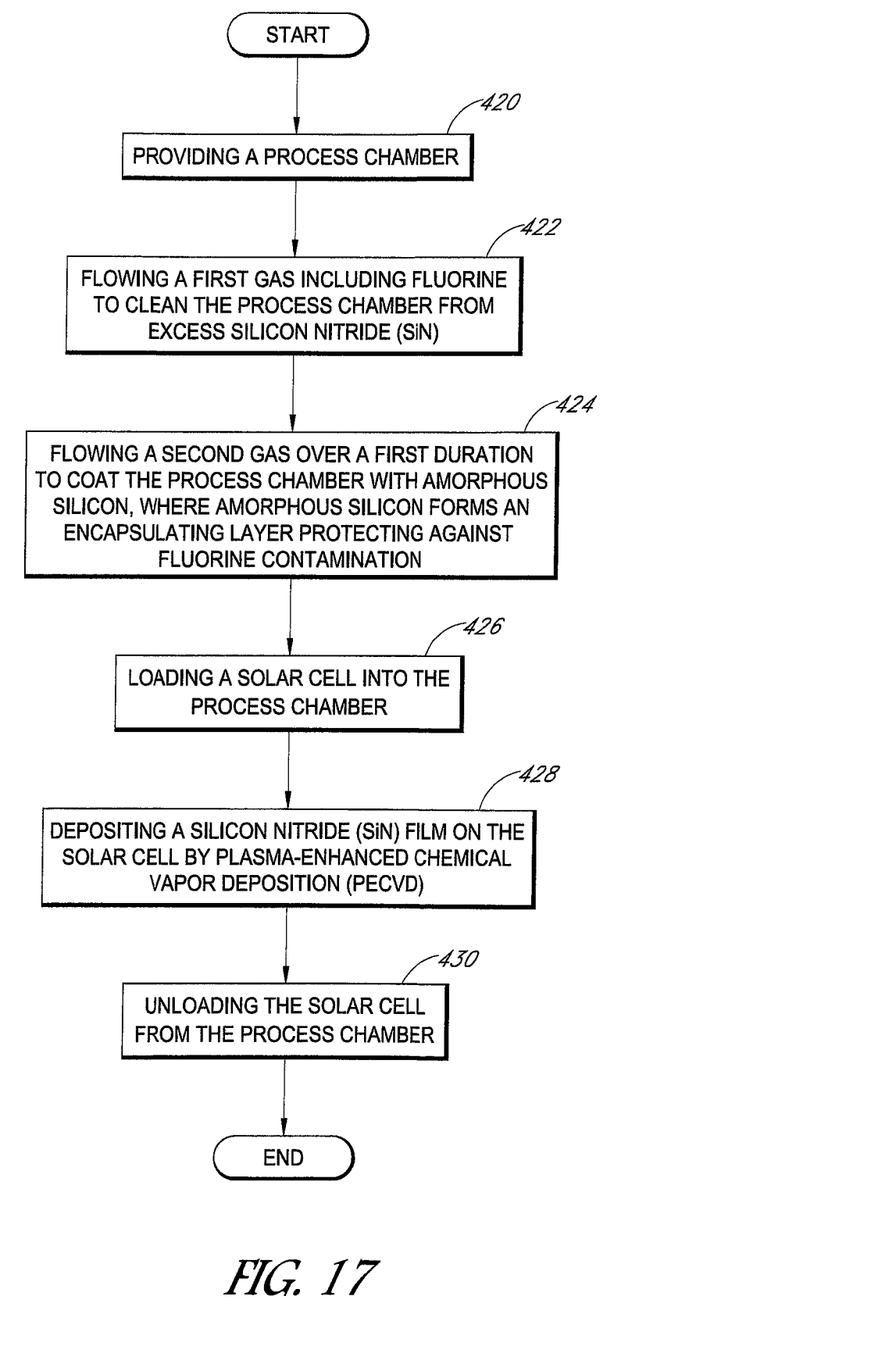
FIGS. 17 and 18 are flowchart representations of forming a silicon nitride film on a solar cell in accordance with an embodiment of the present invention.

FIG. 17 illustrates a flow chart of an embodiment for forming a silicon nitride film on a solar cell is shown. As described above, the first operation 420 can include providing a process chamber 310. The second operation 422 can include flowing a first gas having fluorine 320 to clean a process chamber 310 from excess silicon nitride (SiN) 330. The third operation 424 can include flowing a second gas 322 for a first duration to coat the process chamber with amorphous silicon and where the amorphous silicon forms a first encapsulating layer 350 to protect against fluorine contamination. The fourth operation 426 can include loading a solar cell 300 in the process chamber 310. The fifth operation 428 can include depositing a silicon nitride film 370 on the solar cell 300 by plasma-enhanced chemical vapor deposition (PECVD). The last operation can 430 includes unloading the solar cell 300 from the process chamber 310.

Figure 18:
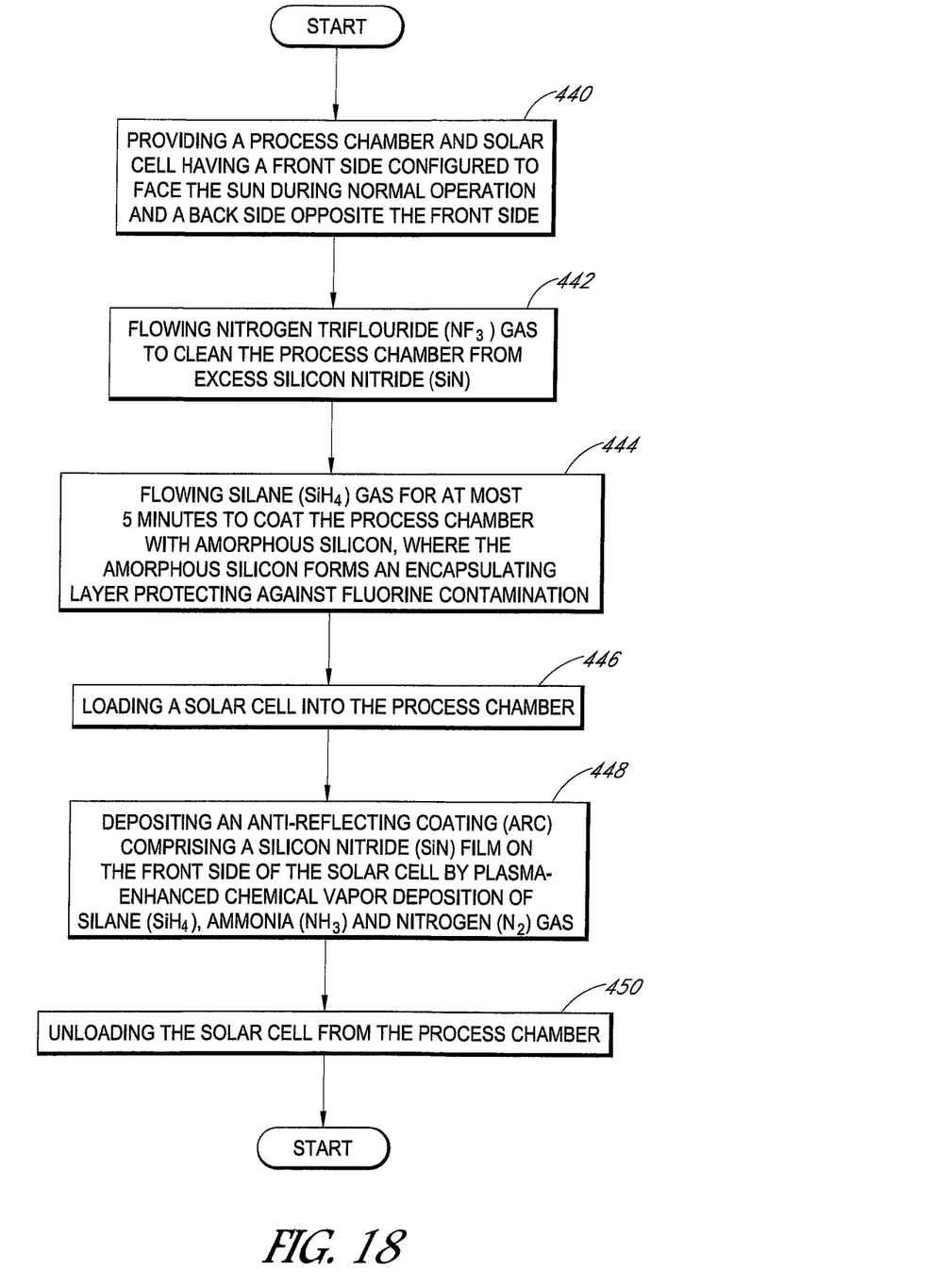

With reference to FIG. 18, a flow chart of an embodiment for forming a silicon nitride film on a solar cell is shown. As described above, the first operation 440 can include providing a process chamber 310 and solar cell 300 having a front side configured to face the sun during normal operation and a back side opposite the front side. The second operation 442 can include flowing nitrogen triflouride ($NF_3$) gas 320 to clean a process chamber 310 from excess silicon nitride (SiN) 330. The third operation 444 can include flowing silane ($SiH_4$) gas 322 for at most 5 minutes to coat the process chamber with amorphous silicon and where the amorphous silicon forms a first encapsulating layer 350 to protect against fluorine contamination. The fourth operation 446 can include loading the solar cell 300 in the process chamber 310. The fifth operation 448 can include depositing an anti-reflective coating (ARC) layer 370 including a silicon nitride (SiN) film on the front side of the solar cell 300 by plasma-enhanced chemical vapor deposition (PECVD) of silane ($SiH_4$), ammonia ($NH_3$) and nitrogen ($N_2$) gas. The last operation 450 can include unloading the solar cell 300 from the process chamber 310.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for forming a thin film on a substrate, the method comprising:
    cleaning a process chamber by flowing a first gas comprising fluorine into the process chamber;
    after flowing the first gas comprising fluorine into the process chamber, coating the process chamber with a first encapsulating layer comprising amorphous silicon by flowing a second gas for a first duration into the process chamber, wherein the first encapsulating layer protects against fluorine contamination;
    after coating the process chamber with the first encapsulating layer, loading a substrate into the process chamber;
    depositing a thin film on the substrate by flowing a third gas into the process chamber; and
    unloading the substrate from the process chamber.

2. The method of claim 1, wherein the thin film is a silicon nitride (SiN) film.

3. The method of claim 1, wherein the first gas comprises nitrogen triflouride (NF3).

4. The method of claim 1, wherein the second gas comprises silane (SiH4).

5. The method of claim 1, wherein the third gas comprises a gas selected from the group containing silane (SiH4), ammonia (NH3) and nitrogen (N2).

6. The method of claim 1, wherein the first duration is in the range of 0.5-5 minutes.

7. The method of claim 1, wherein the substrate is a solar cell.

8. The method of claim 7, wherein forming a thin film on the substrate comprises forming an anti-reflective coating (ARC) comprising a silicon nitride film on the solar cell.

9. The method of claim 1, wherein the substrate is a liquid crystal display (LCD).

10. The method of claim 9, wherein forming a thin film on a liquid crystal display (LCD) comprises forming an insulating layer on a liquid crystal display (LCD).

11. A method for forming a silicon nitride film on a solar cell, the method comprising:
    cleaning a process chamber to remove excess silicon nitride (SiN) by flowing a first gas comprising fluorine into the process chamber;
    after flowing the first gas into the process chamber, coating the process chamber with amorphous silicon by flowing a second gas for a first duration into the process chamber, wherein amorphous silicon forms a first encapsulating layer protecting against fluorine contamination;

loading a solar cell in the process chamber;
depositing a silicon nitride film on the solar cell by plasma-enhanced chemical vapor deposition; and
unloading the solar cell from the process chamber.

12. The method of claim 11, wherein the first gas comprises nitrogen triflouride (NF3).

13. The method of claim 11, wherein the second gas comprises silane (SiH4).

14. The method of claim 11, wherein the third gas comprises a gas is selected from the group containing silane (SiH4), ammonia (NH3) and nitrogen (N2).

15. The method of claim 11, wherein the first duration is in the range of 0.5-5 minutes.

16. The method of claim 11, wherein amorphous silicon forms a first encapsulating layer with a thickness in the range of 0.05-0.5 microns.

17. A method for forming a silicon nitride film on a solar cell, the solar cell having a front side configured to face the sun during normal operation and a back side opposite the front side, and the method comprising:
cleaning a process chamber to remove excess silicon nitride (SiN) by flowing nitrogen triflouride (NF3) gas into the process chamber;
after flowing the NF3 gas into the process chamber, coating the process chamber with amorphous silicon by flowing silane (SiH4) gas for at most 5 minutes into the process chamber, wherein the amorphous silicon forms a first encapsulating layer protecting against fluorine contamination;
after coating the process chamber with amorphous silicon, loading a solar cell in the process chamber;
depositing an anti-reflective coating (ARC) comprising a silicon nitride (SiN) film on the front side of the solar cell by plasma-enhanced chemical vapor deposition (PECVD) of silane (SiH4), ammonia (NH3) and nitrogen (N2) gas; and
unloading the solar cell from the process chamber.

18. The method of claim 17, wherein forming a silicon nitride (SiN) film on a front side of a solar cell comprises forming an anti-reflective coating on a back side (BARC) of a solar cell.

19. The method of claim 17, wherein the solar cell comprises a solar cell selected from the group containing a back-contact solar cell, front-contact solar, monocrystalline silicon solar cells, polycrystalline silicon solar cells, amorphous silicon solar cells, thin film silicon solar cells, copper indium gallium selenide (CIGS) solar cells, and cadmium telluride solar cells.

20. The method of claim 17, wherein amorphous silicon forms a first encapsulating layer with a thickness in the range of 0.05-0.5 microns.

* * * * *